(12) United States Patent
Rosenbaum et al.

(10) Patent No.: US 9,387,148 B2
(45) Date of Patent: Jul. 12, 2016

(54) DOSAGE FORM PACKAGE AND A FRANGIBLE ELECTRICAL CIRCUIT SHEET THEREFOR

(75) Inventors: Ronald Rosenbaum, Palm Harbor, FL (US); Vincent G. D'Agostino, Walpole, MA (US); Robert J. Depke, Orland Park, IL (US)

(73) Assignee: MTS Medication Technologies, Inc., St. Petersburg, FL (US)

( * ) Notice: Subject to any disclaimer, the term of this patent is extended or adjusted under 35 U.S.C. 154(b) by 0 days.

(21) Appl. No.: 12/578,214

(22) Filed: Oct. 13, 2009

(65) Prior Publication Data
US 2010/0089791 A1    Apr. 15, 2010

Related U.S. Application Data

(63) Continuation-in-part of application No. 12/288,003, filed on Oct. 14, 2008.

(51) Int. Cl.
| | |
|---|---|
| G08B 13/14 | (2006.01) |
| A61J 1/03 | (2006.01) |
| H05K 1/02 | (2006.01) |
| A61J 7/04 | (2006.01) |
| H05K 1/16 | (2006.01) |
| H05K 3/00 | (2006.01) |

(52) U.S. Cl.
CPC .............. *A61J 1/035* (2013.01); *H05K 1/0286* (2013.01); *A61J 7/0481* (2013.01); *A61J 2007/0436* (2013.01); *A61J 2200/30* (2013.01); *H05K 1/0293* (2013.01); *H05K 1/167* (2013.01); *H05K 3/005* (2013.01); *H05K 2203/162* (2013.01); *H05K 2203/175* (2013.01)

(58) Field of Classification Search
CPC . A61J 1/035; A61J 7/0481; A61J 2007/0436; A61J 2007/0418; H05K 1/0293; B65D 2585/56
USPC .......... 340/652, 568.1, 539.12; 206/528, 530, 206/531, 534
See application file for complete search history.

(56) References Cited

U.S. PATENT DOCUMENTS

| | | | | |
|---|---|---|---|---|
| 4,526,474 | A | * 7/1985 | Simon ...................... | A61J 7/04 116/308 |
| 4,616,316 | A | 10/1986 | Hanpeter et al. | |
| 4,617,557 | A | * 10/1986 | Gordon ...................... | 340/309.7 |
| 4,660,991 | A | 4/1987 | Simon | |
| 5,181,189 | A | * 1/1993 | Hafner ........................... | 368/10 |
| 5,412,372 | A | * 5/1995 | Parkhurst ............ | G06F 19/3462 221/15 |
| 5,622,652 | A | * 4/1997 | Kucherovsky ......... | G01V 15/00 106/1.18 |
| 5,763,058 | A | * 6/1998 | Isen et al. ...................... | 428/209 |
| 5,836,474 | A | * 11/1998 | Wessberg ........................ | 221/25 |
| 5,856,195 | A | * 1/1999 | Charlton .......... | G01N 33/48771 204/403.14 |
| 5,883,806 | A | 3/1999 | Meador et al. | |

(Continued)

*Primary Examiner* — Jennifer Mehmood
*Assistant Examiner* — Rufus Point
(74) *Attorney, Agent, or Firm* — Robert J. Depke; The Chicago Technology Law Group, LLC

(57) ABSTRACT

A frangible electrical circuit sheet for a dosage form package includes a first plurality of electrically conductive trace subnetworks interconnected with one another to form a network of electrically conductive traces and disposed on the sheet. The sheet further includes a second plurality of circuit elements connected to the network of electrically conductive traces such that each circuit element is associated with one of the subnetworks. At least some of the circuit elements have element values that differ from one another.

17 Claims, 6 Drawing Sheets

(56) References Cited

U.S. PATENT DOCUMENTS

| | | | |
|---|---|---|---|
| 6,011,999 A | 1/2000 | Holmes | |
| 6,175,779 B1 | 1/2001 | Barret | |
| 6,335,907 B1 | 1/2002 | Momich et al. | |
| 6,411,567 B1* | 6/2002 | Niemiec | A61J 7/0481 368/10 |
| 6,539,281 B2 | 3/2003 | Wan et al. | |
| 6,574,166 B2* | 6/2003 | Niemiec | 368/10 |
| 6,771,174 B2 | 8/2004 | Broas | |
| 7,113,101 B2* | 9/2006 | Petersen | A61J 1/035 340/590 |
| 7,126,879 B2* | 10/2006 | Snyder | A61J 7/0481 206/531 |
| 7,475,784 B2* | 1/2009 | Simon et al. | 206/534 |
| 7,489,594 B2* | 2/2009 | Simon et al. | 368/10 |
| 7,502,666 B2* | 3/2009 | Siegel | G06F 19/3462 700/236 |
| 7,552,824 B2* | 6/2009 | Le et al. | 206/534 |
| 7,612,662 B2* | 11/2009 | Niemiec et al. | 340/539.12 |
| 7,726,485 B2* | 6/2010 | Brollier | A61J 1/035 206/532 |
| 7,878,367 B2* | 2/2011 | Simon | A61J 7/0481 116/308 |
| 8,091,790 B2* | 1/2012 | Mickle | B65D 75/327 235/435 |
| 8,151,990 B2* | 4/2012 | Udo | A61J 1/035 206/531 |
| 8,960,440 B1* | 2/2015 | Kronberg | A61J 1/035 206/531 |
| 2004/0047764 A1* | 3/2004 | Purcell | G01N 33/48771 422/501 |
| 2005/0162979 A1* | 7/2005 | Ostergaard | A61J 1/035 368/10 |
| 2005/0225445 A1* | 10/2005 | Petersen | B65D 5/42 340/568.2 |
| 2005/0256830 A1 | 11/2005 | Siegel et al. | |
| 2005/0288082 A1* | 12/2005 | de la Huerga | A63F 9/0811 463/9 |
| 2008/0223936 A1* | 9/2008 | Mickle | B65D 75/327 235/492 |
| 2010/0089791 A1* | 4/2010 | Rosenbaum | A61J 1/035 206/531 |
| 2014/0231518 A1* | 8/2014 | Yosui | H01Q 1/2216 235/439 |

* cited by examiner

US 9,387,148 B2

DOSAGE FORM PACKAGE AND A FRANGIBLE ELECTRICAL CIRCUIT SHEET THEREFOR

The present application contains subject matter related to that disclosed in U.S. patent application Ser. No. 12/288,003. The present application is a Continuation-In-Part of U.S. patent application Ser. No. 12/288,003 filed on Oct. 14, 2008, the entire contents of which is hereby incorporated by reference.

BACKGROUND OF THE INVENTION

1. Field of the Invention

The present invention relates generally to storage, dispensing, control, and monitoring of dosage forms of varying or identical forms, and more particularly, to devices for same.

2. Description of the Background of the Invention

In the healthcare industry, the storing and controlled dispensing of dosage forms that may comprise, for example, capsules, pills, caplets, suppositories, ampoules of liquid, and/or any other forms for dispensing medications or other health-related items or substances, such as a nutritional supplement, may require a complex set of manual procedures to be undertaken before a particular dosage form reaches and is administered to a patient. Errors in administration of the medication or other item can and do occur, even when the procedures incorporate safeguards to protect against such errors. Further, such procedures and systems implementing those procedures have suffered from the disadvantage that the tracking of dispensing and accounting for patient billing purposes are not ideally implemented.

Many healthcare facilities utilize distribution centers at which employees inventory, process, package, and distribute medical and dietary dosage forms in blister packages, vials, or other containers. In some existing systems, medical and dietary dosage forms are requested for an automated dispensing system typically disposed at a location remote from the distribution center. The packaged medical or dietary dosage forms are transported to the requesting healthcare provider and must thereafter be correctly loaded into the automated dispensing system. In some systems, the dosage forms must be associated with patients. In such a setting, human error at any point in this process can result in incorrect distribution and administration of dosages, at times, with undesirable results. Additionally, existing dispensing systems and devices may be inefficient in situations where several medications must be dispensed at scheduled times and/or when immediate dispensing is needed, such as in an emergency room or in the case of a new patient.

Once medications are received, processed, and stored by a healthcare or other facility there is sometimes a lack of complete assurance whether the correct medication(s) or other item(s) or substance(s) have been properly dispensed to and/or taken by patients. Some facilities employ a system having medications for multiple patients therein, wherein the dispensing of medications is monitored by the system. A device used in such a system includes a number of compartments therein, wherein when a compartment is opened and one or more medication(s) or other item(s) or substance(s) are removed from the compartment, the system stores time of opening, an identification of the medication(s), item(s), and/or substance(s) that were stored in such compartment, and information regarding the patient associated with the medication(s), item(s), and/or substance(s) that were stored in the compartment.

SUMMARY OF THE INVENTION

According to a first aspect of the present invention, a frangible electrical circuit sheet for a dosage form package includes a first plurality of electrically conductive trace subnetworks interconnected with one another to form a network of electrically conductive traces disposed on the sheet. The sheet further includes a second plurality of circuit elements connected to the network of electrically conductive traces such that each circuit element is associated with one of the subnetworks. At least some of the circuit elements have element values that differ from one another.

According to a first aspect of the present invention, a dosage form package includes a sheet of material defining a first plurality of cavities and a frangible electrical circuit sheet disposed adjacent the sheet of material such that the cavities are fully enclosed at least in part by the circuit sheet. The frangible electrical circuit sheet includes a second plurality of electrically conductive trace subnetworks interconnected with one another to form a network of electrically conductive traces and each subnetwork is aligned with one of the cavities. A third plurality of circuit elements is connected to the network of electrically conductive traces such that each circuit element is associated with one of the subnetworks. At least some of the circuit elements have element values that differ from one another and the sheet of material and the frangible electrical circuit sheet form a unitary package.

According to another aspect of the present invention, a dosage form package includes a first sheet having a first plurality of openings therethrough and a second sheet having a second plurality of openings therethrough. The package further includes a third sheet having a third plurality of protrusions defining cavities wherein each protrusion extends through an associated one of the first plurality of openings. A frangible electrical circuit sheet is disposed adjacent the third sheet such that the cavities are enclosed at least in part by the circuit sheet. The second sheet is disposed adjacent the circuit sheet on a side of the circuit sheet opposite the first and third sheets. The frangible electrical circuit sheet includes a fourth plurality of electrically conductive trace subnetworks interconnected with one another to form a network of electrically conductive traces wherein each subnetwork is aligned with one of the cavities. A fifth plurality of circuit elements is connected to the network of electrically conductive traces such that each circuit element is associated with one of the subnetworks. At least some of the circuit elements have element values that differ from one another. Further, at least two of the first, second, third, and circuit sheets are secured together to form a unitary package.

The various features of the present invention will become more readily apparent from a consideration of the following description, to be read in conjunction with the accompanying drawings, in which like reference numerals represent same or similar items.

DETAILED DESCRIPTION OF INVENTION

This application discloses elements similar or identical to those disclosed in U.S. patent application Ser. No. 10/846,243, filed May 14, 2004, the disclosure of which is incorporated by reference herein in its entirety.

Figure 1:
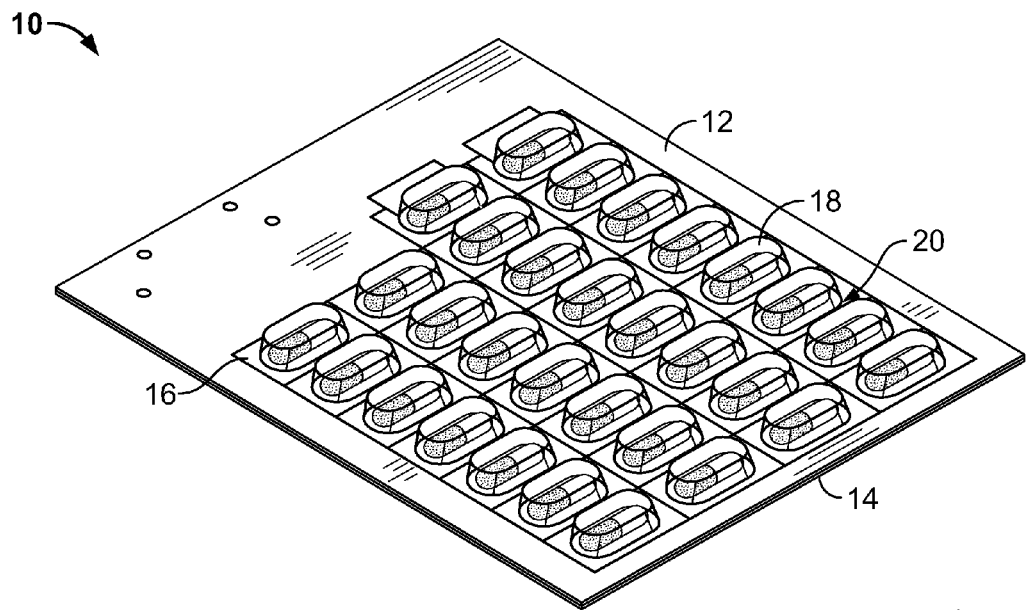
FIG. 1 is a top isometric view showing a first or front side of a medical or dietary dosage form package.
Figure 4:
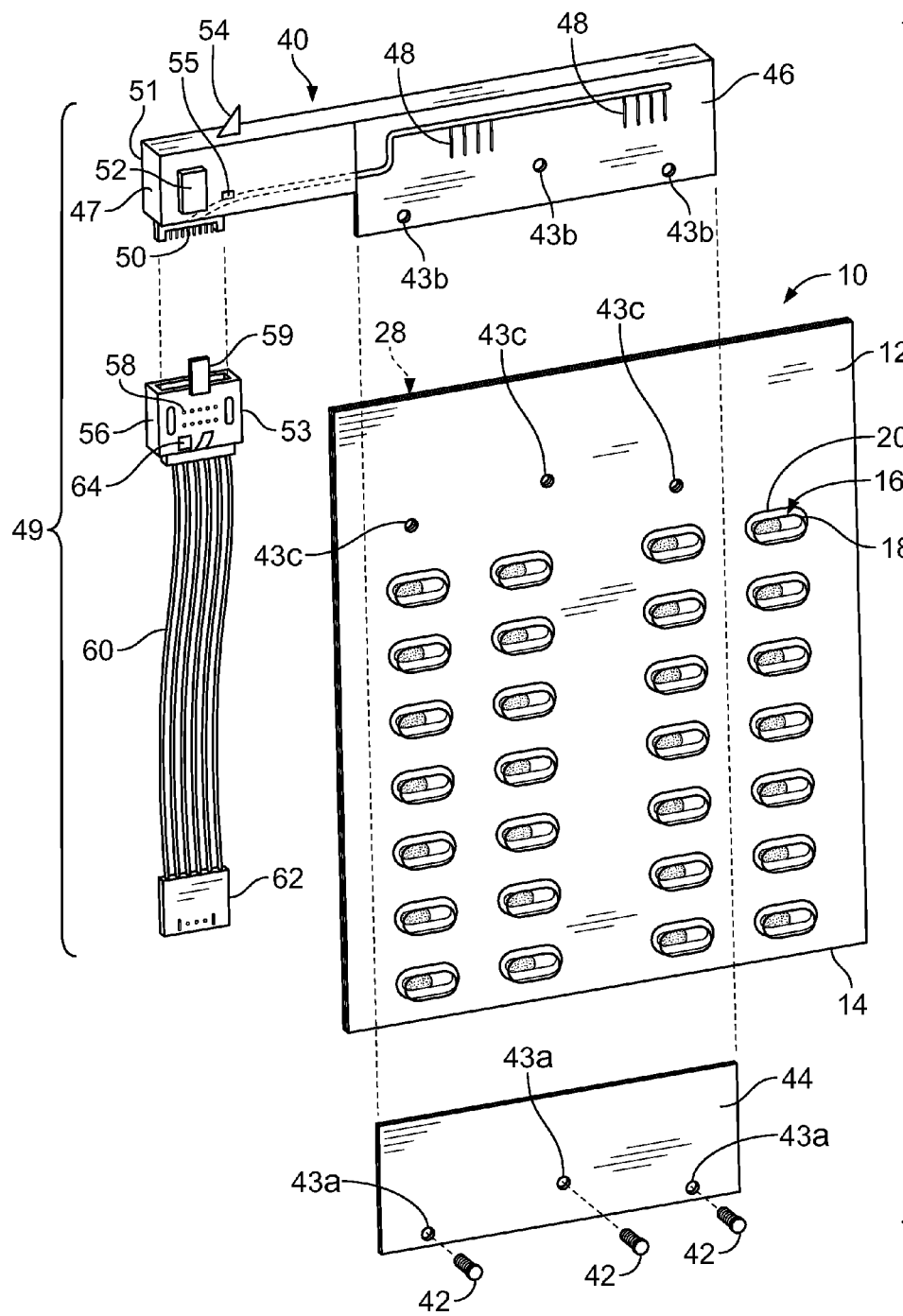
FIG. 4 is an exploded isometric view of the package of FIGS. 1 and 2 and an associated electrical interface device.

Referring to FIG. 1, a medical or dietary dosage form package that may be used in a dosage form control and monitoring system is shown generally at 10. The dosage form package 10 includes a first or front sheet 12 and a second or rear sheet 14. The front and rear sheets 12, 14 are preferably constructed of cardboard, but alternatively may be constructed of any durable material, such as plastic or the like. A sheet of material 16 is disposed between the front and rear sheets 12, 14, wherein the sheet 16 includes a plurality of protrusions defining blister cavities 18. The blister cavities 18 are preferably, although not necessarily, arranged in a regular pattern of rows and columns. FIGS. 1 and 4 illustrate seven rows and four columns, it being understood that different numbers of rows and/or columns may alternatively be provided. In fact, the blister cavities 18 need not be arranged in a regular pattern, but could be irregularly spaced. The sheet 16 is preferably, although not necessarily, made of clear flexible plastic so that the contents of the blister cavities 18 may be viewed. Also, while the sheet 16 is preferably unitary, the sheet 16 could instead comprise separated sections that are arranged together to form the desired arrangement of blister cavities 18. The dosage form package 10 is used to store individual or multiple dosage forms in one or more of the plurality of blister cavities 18. The front sheet 12 includes a plurality of first openings 20 extending therethrough, wherein the first openings 20 are aligned with the plurality of protrusions forming the blister cavities 18 and the blister cavities 18 extend through the first openings 20. In addition, the rear sheet 14 includes a plurality of second openings 22 aligned evenly with the first openings of the front cover 12 and the plurality of protrusions forming the blister cavities 18. The front and rear sheets 14, 16 are preferably identical and the openings 20, 22, respectively, therethrough are preferably symmetric. Also, the front and rear sheets 14, 16 may be separate sheets, but alternatively may be formed of a single sheet folded in half to form the front and rear sheets 14, 16.

Figure 2:
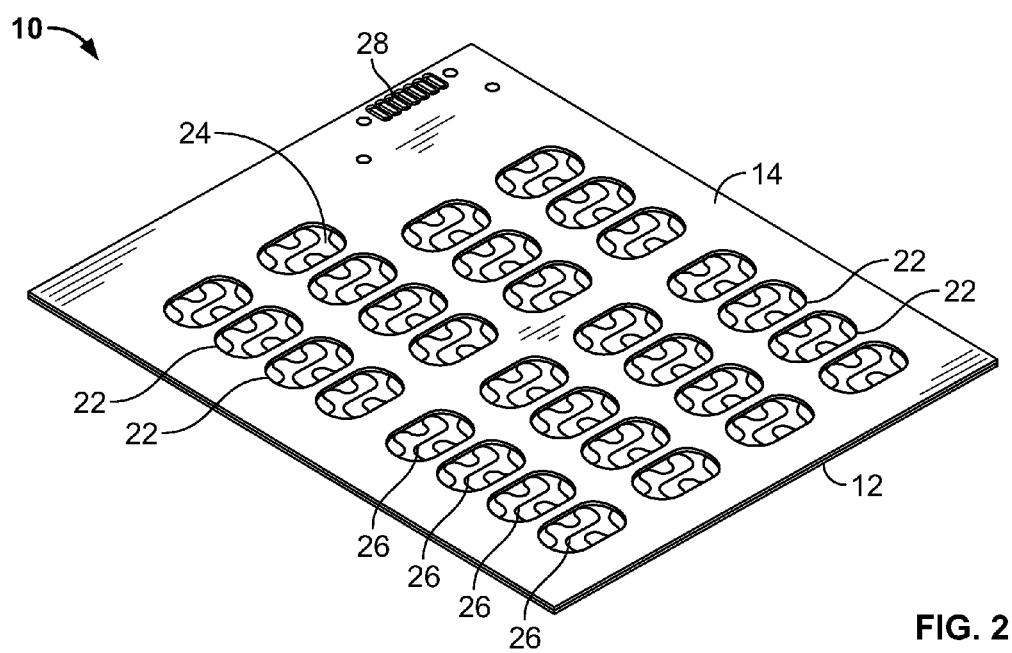
FIG. 2 is a bottom isometric view showing a second or rear side of the package of FIG. 1.

As seen in FIG. 2, a frangible electrical circuit sheet 24 is disposed between the rear sheet 14 and the sheet 16 to provide a barrier to the release of dosage forms from one or more of the blister cavities 18. FIG. 2 also shows that the circuit sheet 24 carries individual bi-state elements or switch elements 26a-1-26g-4 in the form of frangible electrically conductive traces, which are connected together in a network and each of which may be broken and open-circuited when one or multiple dosage forms is expelled from a specific blister cavity 18. FIG. 2 also illustrates electrical terminals 28a-28i of the circuit sheet 24 left uncovered by a corresponding opening in the rear sheet 14. In an alternative embodiment, the sheet 24 may be secured to a rear face of the rear sheet 14. A side of the circuit sheet 24 opposite the bi-state elements 26a-1-26g-4 may be formed of a thin metal foil to limit an amount of moisture and/or oxygen that can travel through the sheet 24 and therefore to dosage forms contained within the blister cavities 18.

Figure 3:
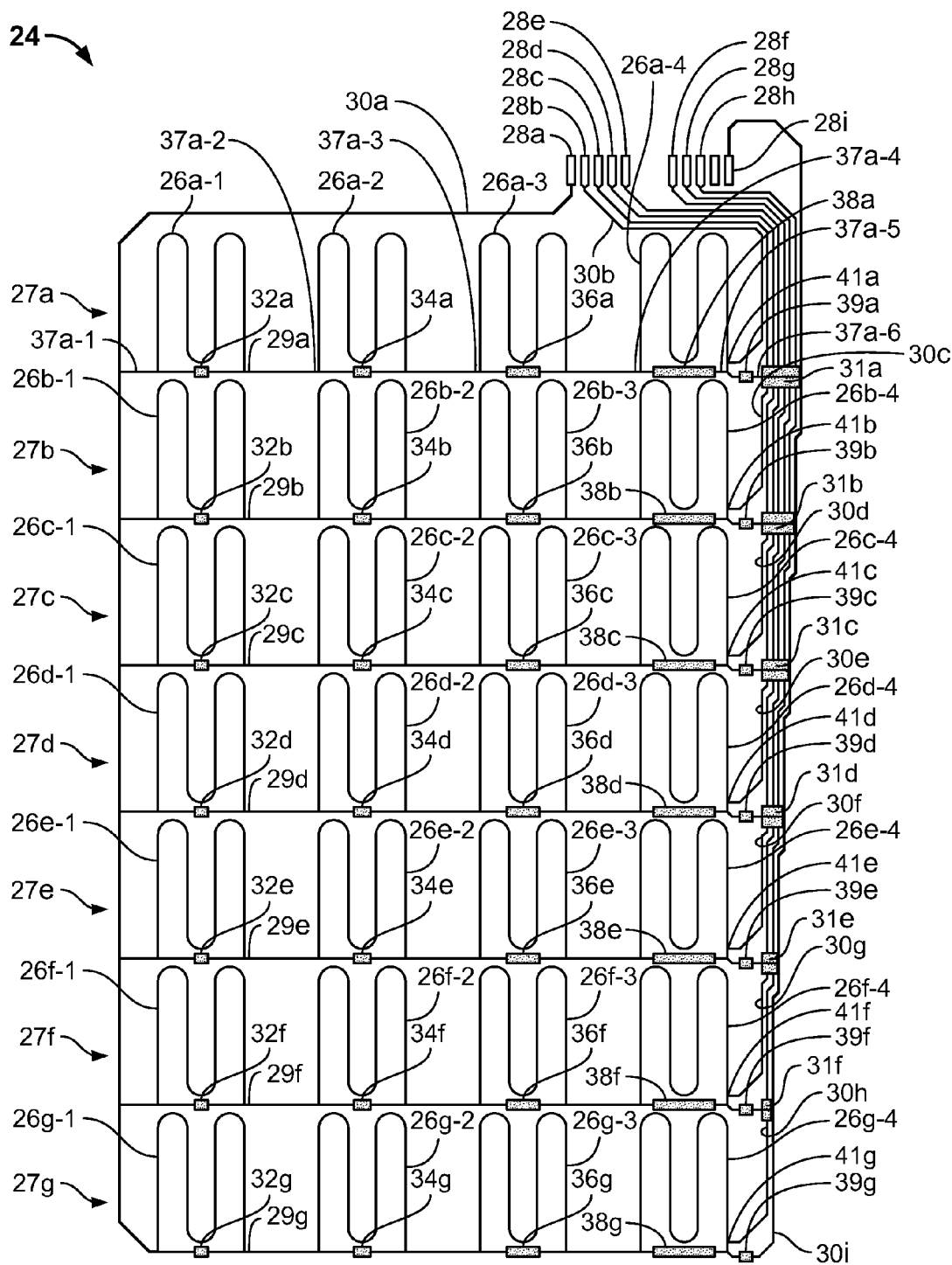
FIG. 3 is a plan view of an electrically conductive trace pattern on an electrical circuit sheet, wherein the electrical circuit sheet may be incorporated into the package of FIG. 1.

FIG. 3 illustrates a network of electrically conductive traces carried by the electrical circuit sheet 24 in greater detail. The network including the bi-state elements 26a-1-26g-4, the electrical terminals 28a-28i, a plurality of conductive electrical traces 30a-30i, insulating material 31a-31f, and circuit elements in the form of resistive elements 32a-32g, 34a-34g, 36a-36g, and 38a-38g may be printed, etched, mechanically attached, or otherwise placed using one or more of these and/or other techniques on an electrically non-conductive substrate material forming the electrical circuit sheet 24. The substrate material may be a single sheet of material as shown in FIG. 3 or may be multi-layered. The electrically conductive traces 30a-30i terminate at the electrical terminals 28a-28i, which are used to connect the dosage form package 10 to a suitable dosage form control system, as described in further detail below. The electrically conductive traces 30a-30i may be made of any suitable electrically conducting material.

Still referring to FIG. 3, the electrical terminals 28a-28g of the electrical circuit sheet 24 include a first end terminal 28a at a first position, a second end terminal 28i at a second position, and subnetwork terminals 28b-28h preferably, but not necessarily, arranged between the first and second end terminals 28a and 28i. The first end terminal 28a and each of the subnetwork terminals 28b-28i are connected to form subnetworks 27a-27g, respectively. A first subnetwork 27a will be described in detail, it being understood that the other subnetworks 27b-27g are formed in the same manner. The traces 30a, 30b connect the terminals 28a, 28b, respectively, to a first row 29a of resistive elements 32a, 34a, 36a, 38a and bi-state elements 26a-1-26a-4. Similarly, the resistive elements 32b-32g, 34b-34g, 36b-36g, 38b-38g and the bi-state elements 26b-26g form rows 29b-29g. The bi-state elements 26a-1, 26a-2, 26a-3, 26a-4 and the resistive elements 32a, 34a, 36a, 38a of the first row 29a are interconnected by traces 37a-1, 37a-2, 37a-3, 37a-4, 37a-5, 37a-6. To form the first subnetwork 27a described above, the terminal 28b is connected to the trace 30b, which in turn is coupled to a junction 41a between the resistors 38a and 39a. In a like fashion, the other subcircuits are formed by connecting the terminals 28b-28h to respective traces 30b-30h, which are coupled to junctions 41b-41g, respectively.

Each of the resistive elements 32a-32g, 34a-34g, 36a-36g, and 38a-38g is connected in parallel with an associated bi-state element 26a-1-26a-4, 26b-1-26b-4, 26c-1-26c-4, 26d-1-26d-4, 26e-1-26e-4, 26f-1-26f-4, and 26g-1-26g-4, respectively. It should be noted that the resistive elements 32a-32g, 34a-34g, 36a-36g, and 38a-38g may all have different resistive values, or may have resistive values that bear a predetermined relationship to one another. As shown in the exemplary embodiment of FIG. 3, the resistive elements 32a-32g have a resistive value of n ohms, the resistive elements 34a-34g have a resistive value of 2 n ohms, the resistive elements 36a-36g have a resistive value of 4 n ohms, and the resistive elements 38a-38g have a resistive value of 8 n ohms, where n can be any integer greater than 0. In the preferred embodiment n=10,000. These resistive values allow an associated system 100, 200, 300 (FIGS. 5, 7, and 8, respectively) to determine which of the bi-state elements 26a-1-26g-4 associated with the resistive elements 32a-32g, 34a-34g, 36a-36g, 38a-38g in a particular row 29a-29g have been broken. This is possible because every combination of resistive elements 32a-32g, 34a-34g, 36a-36g, 38a-38g in a row 29a-29g leads to a different total change in resistance when one or more of the associated bi-state elements 26a-1-26g-4 are broken.

Although the each subnetwork is shown as comprising multiple bi-state elements in a single row, e.g. the elements 26a-1 through 26a-4, etc. in the row 29a, subnetworks can otherwise be formed by any number or combination of bi-state elements. Further, as opposed to the circuit elements 26a-1-26g-4 of FIG. 3, any other bi-state elements that change state in response to removal of a dosage form from a cavity may be utilized. Some examples include mechanical switches, transistors, electrically conductive traces of different shape or form, or combinations thereof. Further, although circuit elements in the form of resistance elements are utilized herein, any combination of resistance elements and other circuit elements, such as capacitors, inductors, diodes, and/or transistors may be utilized as circuit elements herein.

When the circuit sheet 24 opposite an individual blister cavity 18 is ruptured resulting in breakage of the associated bi-state element 26a-1-26g-4, the resistance of the overall network is altered and the storage status of each individual cavity 18 can be tracked and recorded. In a first embodiment, the values of the resistive elements 32a-32g, 34a-34g, 36a-36g, and 38a-38g may have any combination of resistive values that permits identification of exactly which bi-state element(s) 26a-1-26g-4 have been broken and a voltage is applied across the traces 30a and 30i. Any change in current magnitude is detected and an associated computer 106 (FIG. 5) checks a stored table of overall current resistive values to determine which bi-state elements 26a-1-26g-4 are broken. In a further embodiment, the resistance of some or all of the subnetworks 27a-27g can be determined. This is accomplished by separately applying a voltage between the first end terminal 28a and each of the subnetwork terminals 28b-28h on a time-shared (i.e., multiplexed) basis. The current flowing through each subnetwork 27a-27g is measured to obtain separate measurements of the resistances of the subnetworks 27a-27g. The computer 106 then checks the separate subnetwork resistances against a table of resistive values stored in a backup table to determine exactly which bi-state elements 26a-1-26g-4 are broken. In either embodiment, the computer 106 determines which dosage forms have been removed. The computer 106 can also track other information, such as the time the bi-state elements 26a-1-26g-4 were broken, the patient(s) associated with the contents of the broken bi-state elements 26a-1-26g-4, etc. This embodiment can be implemented when all of the resistive elements 32a-32g, 34a-34g, 36a-36g, and 38a-38g have different resistive values or when the resistive values have a predetermined relationship to one another, such as the relationship described above. In any of the embodiments as disclosed herein, the computer 106 may check for resistances within a pre-determined range, thereby reducing the detection of events beyond the breakage of bi-state elements 26a-1-26g-4, such as a short in the thin metal foil forming a side of the circuit sheet 24.

Referring again to FIG. 3, the insulating material 31a-31f is provided over the traces 30c-30h so that the trace 30i can extend over the traces 30c-30h to connect with electrical traces forming each row 29a-29g of a subnetwork 27a-27g, such that the traces 30a and 30i can conduct current to measure the overall resistance of the network. In addition, token resistors 39a-39g are provided in each subnetwork 27a-27g to provide a nominal minimum resistance thereto.

In a specific example, if the bi-state element 26a-1 in the first row, first column position as shown in FIG. 3 has been broken, the current passing through the network from the first end terminal 28a to the second end terminal 28i is reduced by the addition of the resistive element 32a to the resistance of the subnetwork 27a. Under this condition, the resistance of the subnetwork 27a measured between the traces 30a and 30b increases by n ohms as compared to the resistance of the subnetworks 27b-27g before breaking the first row, first column bi-state element 26a-1. As a further example, if the bi-state element 26a-2 in the first row, second column is then broken, the resistance of the subnetwork 27a measured between the traces 30a and 30b after breakage will be increased by 2 n ohms. Another change in electrical current magnitude through the first subnetwork 27a will occur after the breakage of the bi-state element 26a-3 in the third column, due to the addition of the resistive element 36a of value 4 n to the resistance of the subnetwork 27a. Still further, breaking the bi-state element 26a-4 in the fourth column results in addition of the resistive element 38a of value 8 n ohms to the resistance of the subnetwork 27a. This change in the electrical characteristics of each subnetwork 27a-27g can be detected in a multiplexed fashion to measure the drop in resistance for the individual subnetworks 27a-27g so that the computer 106 can determine exactly which bi-state elements 26a-1-26g-4 were broken.

FIG. 4 illustrates the medical or dietary dosage form package 10 in combination with an electrical interface device 40 that may be secured to the package 10 by a variety of means, including but not limited to one or more of adhesives, lamination, rivets, and other fasteners. As seen in FIG. 4, the electrical interface device 40 includes front and back members 44, 46 connected to the dosage form package 10 by rivets 42 that extend through a plurality of holes 43a, 43b in the front and back members 44, 46, respectively, and through a plurality of holes 43c in at least the front and back sheets 12, 14 of the package 10. The rivets 42 may also extend through aligned holes in the sheet 16 if the sheet 16 extends to the area of the package 10 where the rivets 42 are located.

A plurality of electrical contacts 48, preferably, although not necessarily, in the form of bifurcated fingers, bear against and are thus connected to the terminals 28a-28i (FIGS. 2 and 3) on the back of electrical circuit sheet 24. The metal forming these contacts 48 extends along the electrical interface device 40 to a point where it is electrically connected to pins 50 of a first portion 47 of a connector 49 disposed at a head 51 of the electrical interface device 40. A light pipe 52 and a lever 54 may be disposed in the head 51 of device 40. The lever 54 is operatively coupled to the first portion 47 of the connector 49 and when moved inwardly toward the package 10, moves latches 55 (only one shown) on opposite sides of the first portion 47 inwardly out of interference with arms 59 that extend upwardly from opposite sides of a second portion 53 of the connector 49. Movement of the latches 55 permits detachment of the first portion 47 of the connector from a second portion 53 of the connector 49. Preferably, the second portion 53 of the connector 49 is mounted by any suitable means to a structure within which the form package 10 is to be retained, such as a drawer, as described in greater detail hereinafter. The electrical connection continues through a plurality of wires 60 that terminate in a further connector portion 62. A lamp 64 is provided on the connector 49 as a feedback mechanism which may be utilized to indicate a proper electrical connection through the connector portions 47, 53, and 62, wires 60, pins 50, electrical contacts 48, and the electrical terminals 28, when all of these components are electrically connected to a power source for a dosage form control and monitoring system, as discussed and shown in greater detail hereinafter.

Figure 5:
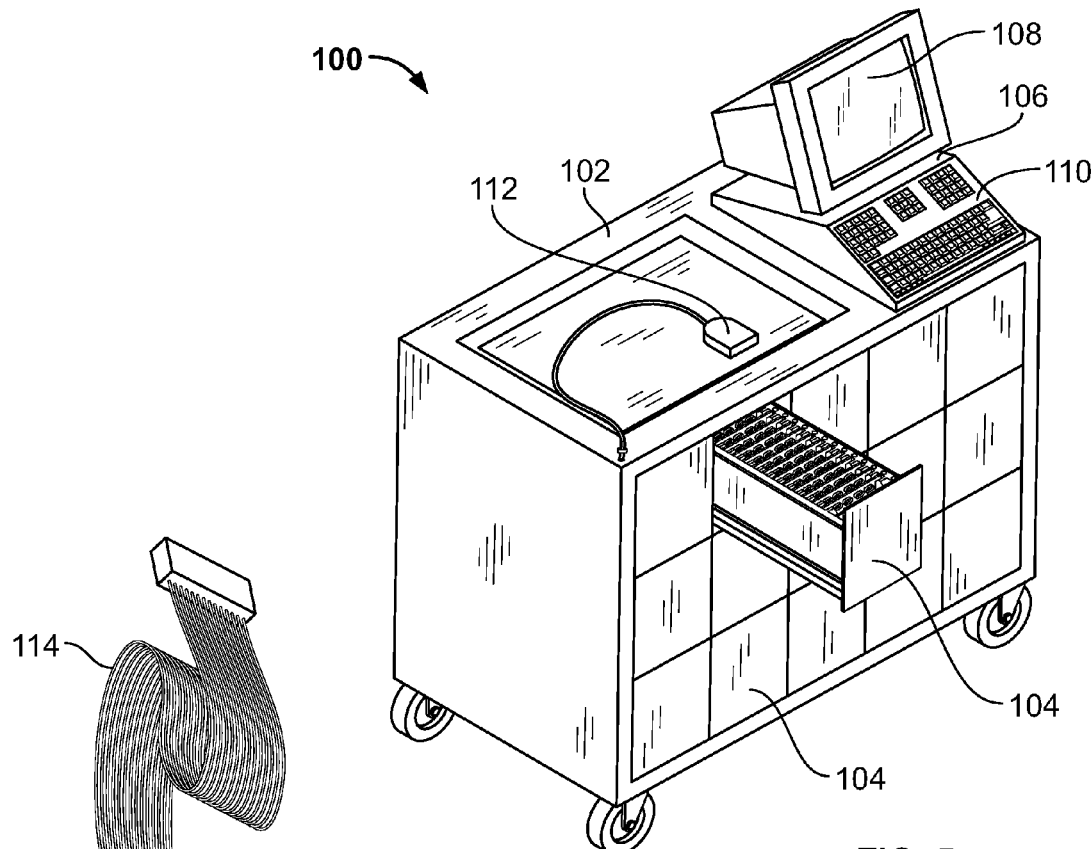
FIG. 5 is a front isometric view of a dosage form control and monitoring system for storing and monitoring dispensing of dosage forms from one or more dosage form packages stored therein.
Figure 6:
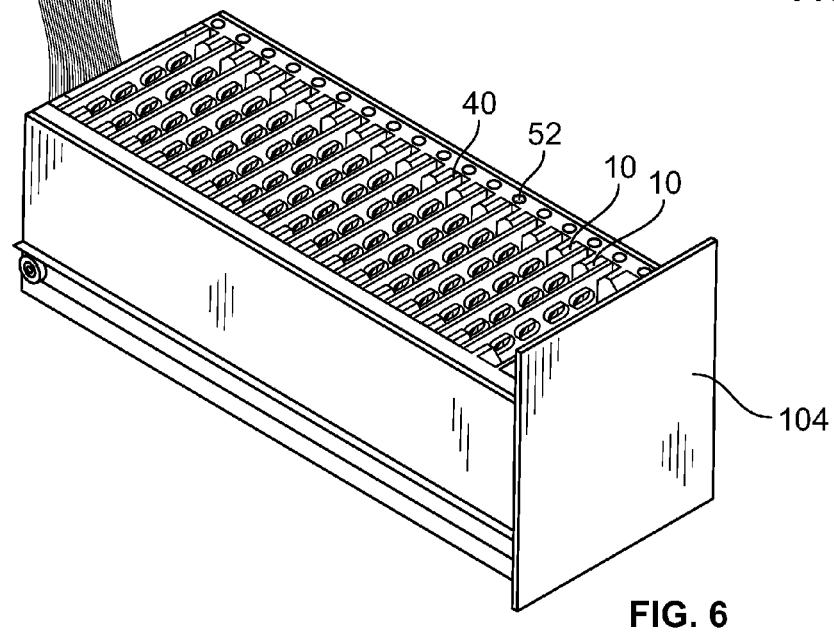
FIG. 6 is a front isometric view of a storage/dispenser unit of the system of FIG. 5 for containing one or more dosage form packages therein.

Referring next to FIGS. 5 and 6, a medical or dietary dosage form control and monitoring system 100 for storage, dispensing, control, and compliance monitoring of medical or dietary dosage form preferably includes a wheeled cabinet 102. The cabinet 102 includes a number of accessible storage/dispensing units, such as lockable drawers 104, in which a plurality of dosage form packages 10 with attached electrical interface devices 40 may be placed. The connector portions 47, 53, 62 of FIG. 4 are mechanically and electrically coupled to matching connector portions of a drawer interface circuit (not shown) disposed within or adjacent each drawer 104. Further, a programmed computer 106 with suitable storage capacity to accommodate a database relating to the multiple dosage form packages 10 is included. The computer 106 includes an output display 108 and input devices, such as a keyboard 110 and mouse 112. In the system of FIGS. 5 and 6, the computer 106 may be capable of undertaking multiple functions such as accessing and processing information that may be related to patient dosing requirements, monitoring access to the dosage forms stored in the packages 10, developing inventory data, and the like. The computer 106 may be a stand-alone device, or may also be connected, physically or wirelessly, to a network wherein the network may include one or more servers connected thereto and wherein processing to undertake system functions might be distributed or reside solely within a single computer on the network, as described in greater detail hereinafter in connection with FIG. 8. It is contemplated that the computer 106 may alternately be any device capable of storing, retrieving, and processing information regarding patients, dosage forms, and inventory, such as a laptop computer, a tablet computer, a personal digital assistant, a cellular phone, or any other device including a microprocessor. One skilled in the art will appreciate that such a computer or other device 106 is capable of processing data based on user inputs or pre-defined requests, as well as communicating with other auxiliary systems through suitable data ports.

The computer or similar processing device 106 is connected to the cabinet 102 via a data connection such as a direct wired connection, the Internet, an intranet, wireless, or infrared technology, Bluetooth, or any other communications protocol. The dosage form control system 100 may advantageously provide a user with convenient access to patient records concerning medical and/or dietary dosage form requirements by accessing such records through the interface of the computer or other device 106.

In the embodiment shown in FIGS. 5 and 6, the drawer interface circuit of each drawer 104 of the cabinet 102 is connected to the computer 106 via a direct electrical connection 114 such as a ribbon cable, a SCSI, EIDE, SATA, eSATA, or USB connection. It will be appreciated by those of ordinary skill in the art that any suitable connection that allows for communication between the drawers 104 and the computer 106 and permits addressing of the drawers by the computer 106 may be utilized to communicate information regarding the contents of the dosage form packages 10 to the dosage form system 100.

Each dosage form package 10 with attached electrical interface device 40 is placed in an appropriate associated and addressable location, or slot, within an associated drawer 104 of the cabinet 102, as shown in FIGS. 5 and 6. The connector portion 62 that is attached to each dosage form package 10 is connected to the drawer interface circuit of the associated drawer 104 as noted above. A power source (not shown) provides power via the direct electrical connection 114 to components of the packages 10. The lamp 64 disposed on each connector 49 is lit when this completed direct electrical connection is made. Alternatively or in addition, the lamp 64 may be used to indicate the desired dosage form package 10 to be removed from the dosage form control system 100 for administration of a dosage form(s) to a patient or to indicate an issue with a particular dosage form package 10 in the dosage form control system 100. The light pipe 52 on the electrical interface device 40 overlays and transmits light from the lamp 64 so that the light may be visible along the edge of the drawer 104, for example, as indicated the light emanating from the light pipe 52 of one of the form packages 10 as shown in FIG. 6.

As one example, the control system 100 is used to administer a patient prescription contained within the cabinet 102. Through use of the computer 106, the system 100 may allow unlocking and opening of an appropriate drawer 104 that contains the dosage form package 10 that is desired for use. The desired dosage form package 10 and its attached electrical interface device 40 are removed from the drawer 104 using the lever 54. Specifically, the lever 54 is moved inwardly toward the package 10, thereby permitting the first portion 47 of the connector 49 to be detached from the second portion 53 of the connector 49. The second portion 53 of the connector 49 is preferably mounted to the drawer 104 or to a structure carried within the drawer 104 in a stationary manner so that the first and second portions 47 and 53 of the connector 49 can be conveniently rejoined and locked together by upward movement of the arms 59 of the second portion 53 of the connector 49 into engagement with the latches 55 of the first portion 47 of the connector 49.

Once the lever 54 is moved inwardly and the form package 10 is removed from the drawer 104, the contents of one or more flexible blister cavities 18 are pushed through the frangible electrical circuit sheet 24, disrupting and breaking one or more of the bi-state elements 26a-1-26g-4. The dosage form package 10 and its attached electrical interface device 40 are returned to the drawer 104 and the change in resistances of the subnetworks 27a-27g and/or the overall network of the form package 10 are detected and recorded by the computer 106 through the direct electrical connection. In the preferred embodiment, each measurement informs the system 100 exactly which bi-state elements 26a-1-26g-4 have been broken. This enables the system 100 to monitor whether the correct medications or dietary supplements have been administered at the correct times.

It can be appreciated by one of ordinary skill in the art that the dosage control system 100 may include additional intermediate mechanisms, controls, data channels, outputs, or inputs to allow for additional interface with the dosage control system 100 by a user or any other data processing apparatus. In addition, the cabinet 102 and drawer 104 configuration of the dosage control system 100 may be embodied as individual slots within a larger cabinet, a carousel-type cabinet, multiple storage cabinets/frames, or any other suitable compartment capable of storing and allowing access to individually addressable dosage form packages 10.

Figure 7:
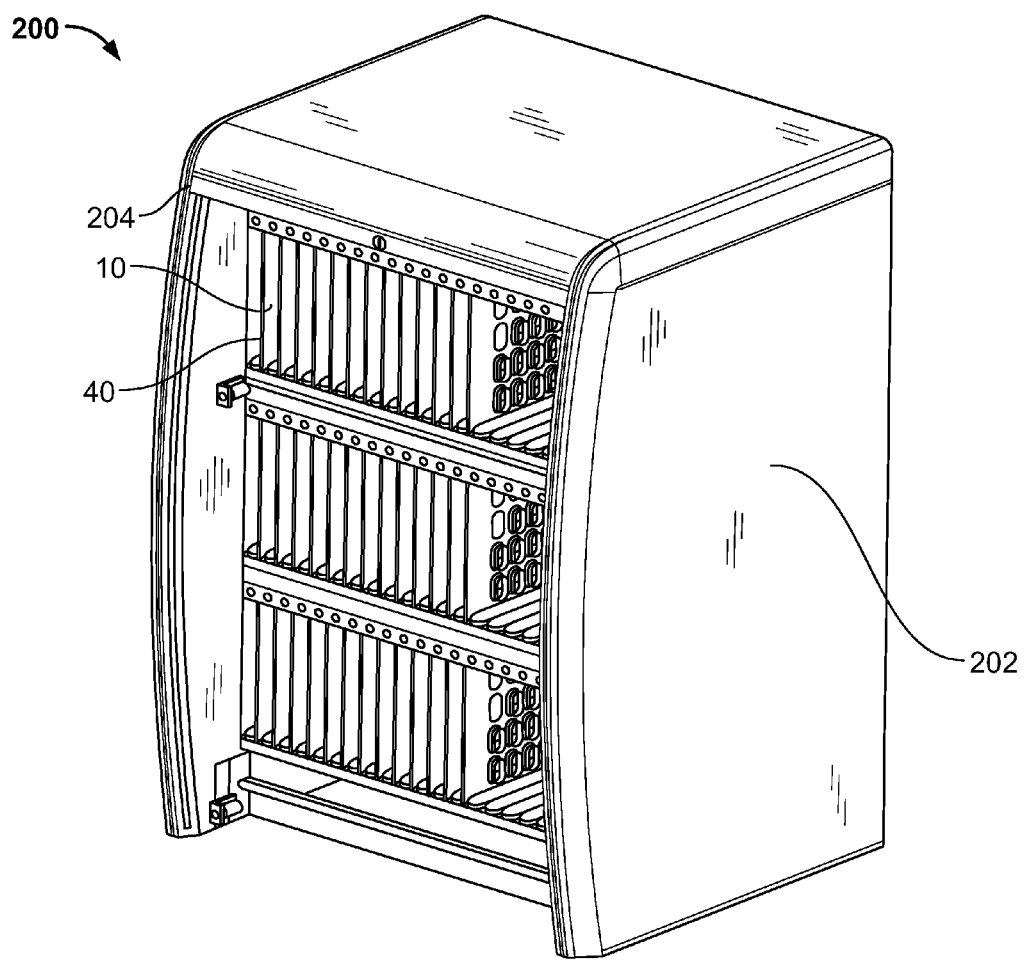
FIG. 7 is a front isometric view of an alternative storage/dispenser unit that may be used in place of the storage/dispenser unit of FIG. 6.

A dosage form control system 200 that includes a storage/dispensing cabinet 202 and a plurality of medical or dietary dosage form packages 10 with connected electrical interface devices 40 arranged in rows and columns is illustrated in FIG. 7. The cabinet 202 may be used in conjunction with the computer 106 (not shown in FIG. 7). An upwardly/downwardly rolling door 204 may be closed and locked, or may be selectively positioned to allow access to particular rows of dosage form packages 10, or the door 204 may be in a fully upward position to provide access to all rows, as shown in FIG. 7. The dosage form packages 10 may be mechanically and electrically interconnected with the cabinet 202 as in the previous embodiment of FIGS. 5 and 6. The dosage form control system 200 may also be connected via a wired or wireless network to provide control and monitoring for the individual dosage form packages 10.

It will be appreciated that the electrical interface devices 40 as disclosed herein may include a variety of elements and technologies for connecting, either through direct electrical connection or wirelessly, to any of a variety of suitable dosage form control systems. For example, each electrical interface device 40 may incorporate its own power source, such as a battery, and may also incorporate an integrated circuit that may contain a timer and memory. In addition, each electrical interface device 40 may include active or passive RFID tags, wired or wireless transceivers, and input and output devices such as buttons, lights, or speakers. With additional included components, each electrical interface device 40 may be placed at a location away from the computer or similar processing device 106 and directly transmit to and receive data from the computer or similar processing device 106 regarding the electrical circuit current and resistance changes that occur when the contents of an individual flexible blister cavity 18 are expelled and an individual switch 26a-1-26g-4 is broken.

Figure 8:
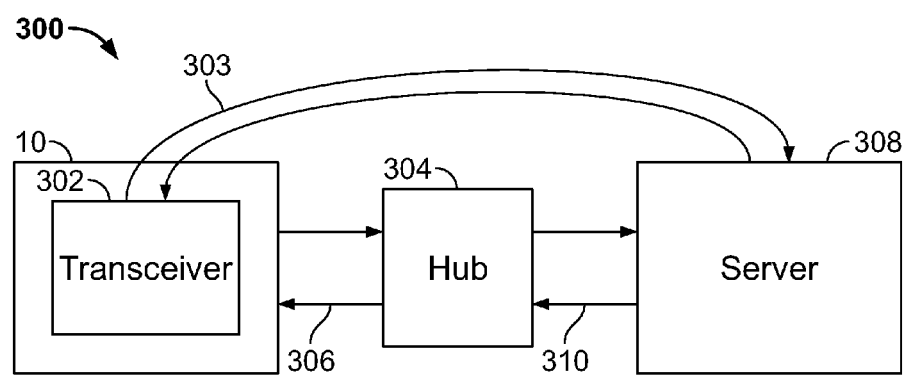
FIG. 8 is a block diagram of hardware for collecting date from one or more control and monitoring systems.

FIG. 8 depicts a further dosage form control system 300 having a transceiver 302 that is electrically connected to or formed as a part of a dosage form package 10. The control system 300 is utilized to monitor patient dosage retrieval in locations where a larger control system, such as the control systems 100, 200 of FIGS. 5 and 7, is not be feasible, such as in a patient's home. Data from a dosage form package 10 may be stored locally at the transceiver 302 through use of sufficient memory to retain the detectable electrical changes to circuit current and resistance when dosage forms are removed from their flexible blister cavities 18 and bi-state elements 26a-1-26g-4 are broken on the electrical circuit sheet 24. In such case, the transceiver 302 communicates directly with a central server 308 over a communication channel 303, wherein the server 308 stores information for that dosage form package 10. The transceiver 302 may also include a power source and one or more input/output devices such as a keypad/keyboard, display screen, light, speaker, or other devices known in the art. Optionally, a hub 304 may be included in the dosage control system 300, as shown in FIG. 8, to act as a relay to transmit or receive data to or from the transceiver 302 across a first communication channel 306. Additionally, the hub 304 may communicate with a server 308 through a second communication channel 310. Each of the communication channels 303, 306, 310 may be any suitable conduit, such as the Internet or a direct wired or wireless connection. The server 308 may be a computer, a web server, or any similar processing device capable of maintaining a database of electrical circuit data received from the dosage form packages 10 connected to the transceivers 302. Preferably, the transceiver 302 of the control system 300 uses low power and complies with requisite allowable power and frequency regulations, both federal and international.

Figure 9:
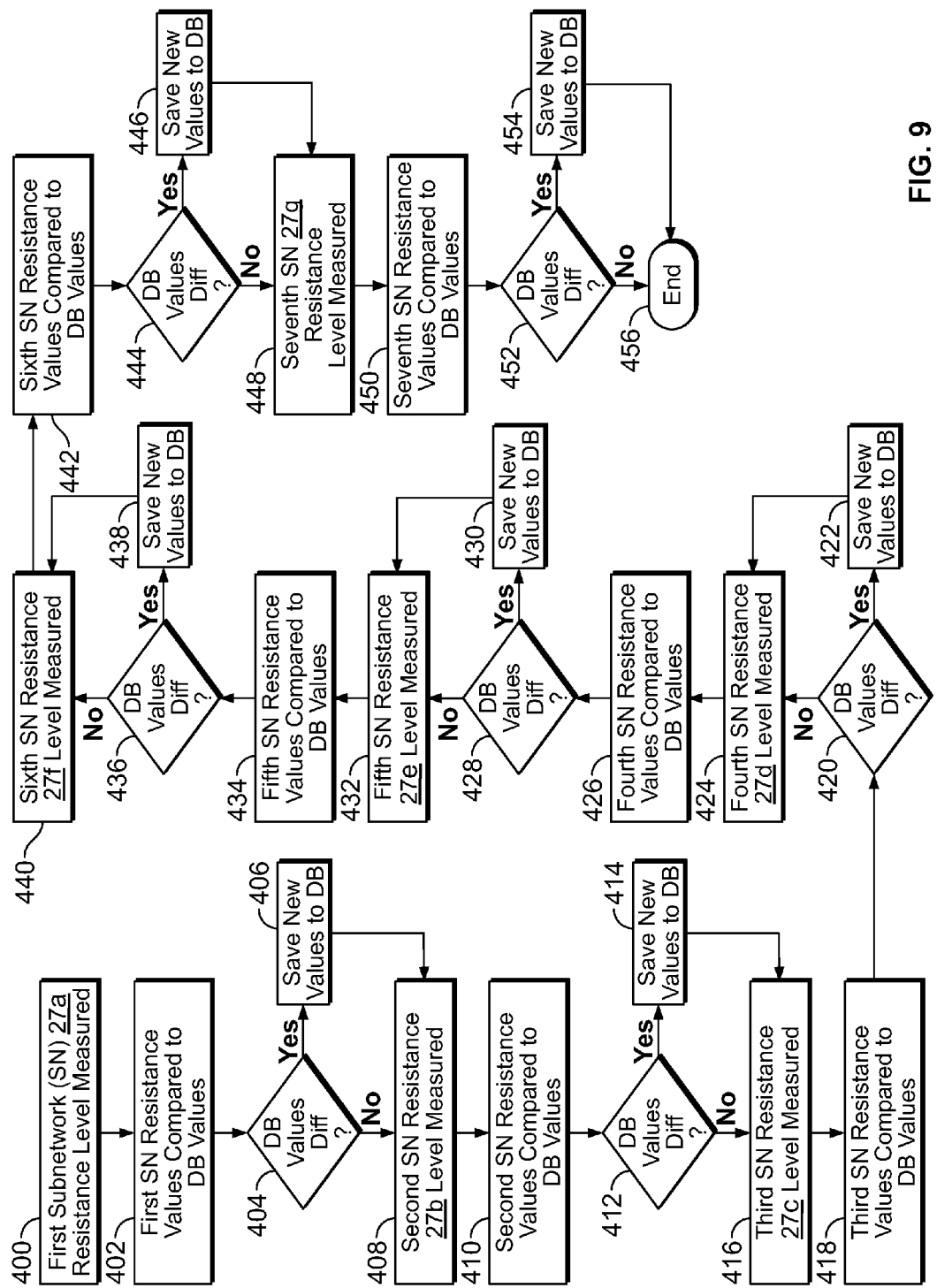
FIG. 9 is a flow chart depicting programming executed by the computer of FIG. 5 to implement the control and monitoring system.

FIG. 9 depicts programming for the computer or similar processing device 106 of FIG. 5 when one or more dosage form packages 10 (FIGS. 1 and 2) are connected to the dosage form control system 100 (FIG. 5) or 200 (FIG. 7) by one or more electrical interface devices 40 (FIG. 4). Trigger events are set within the computer 106, wherein when such trigger events occur, the process of FIG. 9 is initiated. Such trigger events include, but are not limited to, scanning of a dosage form package 10, opening of a cabinet or drawer within the system 100, or a timed event (e.g., running the process of FIG. 9 every second or fraction thereof, minute, 10 minutes, 30 minutes, 1 hour, 1 day, 1 week, etc.).

Still referring to FIG. 9, upon the occurrence of a trigger event, the first subcircuit 27a resistance is measured by a block 400, as discussed above. The overall first subnetwork 27a resistance value is compared by a block 402 to a previously recorded subnetwork 27a resistance value. If a block 404 determines that the two resistance values are different, a block 406 saves the current subnetwork 27a resistance value and/or an identification of which bi-state element(s) 26a-1-26a-4 have been replaced. In addition, other parameter(s) may be updated in the database(s), such as time, type of dosage, forms removed, accounting information, patient information, and the like. On the other hand, if the block 404 determines that there is no change in the resistive value of the subnetwork 27a, the block 406 is skipped. Subsequent blocks 408, 416, 424, 432, 440, and 448 check the resistances of the remaining subnetworks 27b-27g, blocks 410, 418, 426, 434, 442, and 450 compare the resistances, and blocks 414, 422, 430, 438, 446, and 454 optionally saves the current subnetwork 27a-27g resistance value and/or an identification of which bi-state element(s) 26b-1-26g-4 have been replace in an identical fashion and thereafter the process terminates at block 456.

It is contemplated that the parts and features of any one of the specific embodiments described can be interchanged with the parts and features of any other of the embodiments without departing from the spirit and scope of the present disclosure. The foregoing description discloses and describes merely exemplary embodiments of the present disclosure and is not intended to be exhaustive or to limit the disclosure to the precise form disclosed. As will be understood by those skilled in the art, the disclosure may be embodied in other specific forms, or modified or varied in light of the above teachings, without departing from the spirit, novelty or essential characteristics of the present disclosure. Accordingly, the disclosed embodiments are intended to be illustrative, but not limiting, of the scope of the invention, which is set forth in the following claims.

The inventors have now also determined that alternate circuit arrangements are also possible which can be utilized in accordance with the present invention. Specifically, for example, the inventors now recognize that it is possible to eliminate the requirement of forming a separate resistor element as described above. Additionally, it is now also recognized that alternate circuit elements may be utilized in place of the resistor elements described in the embodiments set forth above. More particularly, the inventors note that in its broadest characterization, the present invention relies upon changes in at least one measurable circuit parameter which is advantageously initiated by breaking the blister package cavity seal and eliminating a parallel connection between circuit nodes. The measurement of the at least one circuit characteristic or parameter can be utilized to determine whether certain individual blister packages have been opened.

In accordance with one alternate preferred exemplary embodiment, in place of the parallel connection of a single conductive trace and a resistor element as described above, parallel connected printed conductive signal lines having a predetermined or known resistance value per linear dimension may be provided. In such an arrangement, the conductive signal lines having a known resistance per linear dimension are formed such that each pair of signal lines forming a parallel connection between the nodes has a least one signal line formed across the backing material that closes the blister package. Consequently, when the blister package cavity is opened, the resistance value between the signal nodes changes in a known way by altering the resistance between the nodes from being the effective parallel connection of two resistors to a series connection of the single remaining resistance having a known resistance per linear dimension.

By appropriately selecting and printing preferably incrementally different resistance values for the signal lines, a simple resistance measurement, current measurement or voltage drop determination can be used to determine which one or ones of the individual package cavities have been opened. The principle of operation for this alternate embodiment is essentially the same as the systems and methods described above. Significantly, however, the previous requirement for forming a special resistor element is eliminated and parallel connected conductive traces having known resistance values are utilized. Alternatively, the two embodiments may be combined such that a conductive signal line provides a short-circuit between nodes but the resistive element is replaced with a signal line having a known resistance value.

In yet another alternate preferred embodiment, the resistance or resistor element placed between each node is replaced with an alternate electronic component such as, for example, a capacitor and/or inductor. The inventors have now recognize that the breaking of a parallel connection between adjacent signal nodes can be used to alter the circuit parameters such that it is possible to measure a circuit characteristic such as, for example, the inductance, capacitance and/or complex impedance across the circuit such that it is also possible to determine which individual blister package cavity locations have been opened even when using these alternate types of circuit elements. Those skilled in the art will appreciate that it is not necessary to use simple DC voltage, current or resistance measurements to determine which cavities have been opened. Specifically, those skilled in the art will recognize that RF signals may be utilized in measuring one or more circuit parameters in order to determine which cavity or cavities have been opened based upon recognized changes in the measured circuit parameters.

We claim:

1. A product package having a frangible electrical circuit and a plurality of individual package cavities, comprising:
   the individual package cavities arranged in rows or columns;
   wherein each individual package cavity has a unique corresponding plurality of electrical paths and at least one circuit element, the at least one circuit element being located in one of the electrical paths and having a predetermined measurable electrical characteristic that facilitates automated identification of whether the corresponding cavity has been opened;
   wherein each individual package cavity has a corresponding frangible electrical circuit that is broken when the individual package cavity is opened, the broken portion eliminating one of the plurality of electrical paths associated with the individual package cavity; and
   further comprising one detection circuit for each row or column of individual package cavities connecting the electrical paths associated with every individual package cavity in the row or column of the package such that one or more electrical parameters corresponding to the detection circuit determines which individual package cavities of the row or column have been opened and further wherein a predetermined value for at least one electrical parameter is associated with each of every possible combination of opened cavities for each row or column.

2. The package of claim 1, wherein each circuit element comprises a resistive element.

3. The package of claim 2, wherein the resistive element associated with each individual package cavity in each row or column differ from one another by powers of two.

4. A solid pharmaceutical blister package, comprising:
   a sheet of material defining a first plurality of cavities; and
   a frangible electrical circuit sheet disposed adjacent the sheet of material such that the first plurality of cavities are fully enclosed at least in part by the circuit sheet:
   the plurality of individual package cavities arranged in rows or columns;
   wherein each individual package cavity has a unique corresponding plurality of electrical paths and at least one circuit element, the at least one circuit element being located in one of the electrical paths and having a predetermined measurable electrical characteristic that facilitates automated identification of whether the corresponding cavity has been opened;
   wherein each individual package cavity has a corresponding frangible electrical circuit that is broken when the individual package cavity is opened, the broken portion eliminating one of the plurality of electrical paths associated with the individual package cavity; and
   further comprising one detection circuit for each row or column of individual package cavities connecting the electrical paths associated with every individual package cavity in the row or column of the package such that one or more electrical parameters corresponding to the detection circuit determines which individual package cavities of the row or column have been opened and further wherein a predetermined value for at least one electrical parameter is associated with each of every possible combination of opened cavities for each row or column.

5. The blister package of claim 4, further comprising solid pharmaceuticals stored in the cavities.

6. The blister package of claim 4, further comprising a programmed computer coupled to a connector, wherein the computer includes means for identifying which individual package cavities have been opened.

7. The blister package of claim 6, wherein the computer further includes means for updating a database.

8. The blister package of claim 6, wherein the connector includes a transceiver that communicates information wirelessly.

9. The blister package of claim 4, wherein each circuit element comprises a resistive element.

10. The blister package of claim 4, wherein each circuit element comprises a resistive element having a resistance value that is dependent upon its position within the package.

11. The blister package of claim 10, wherein the circuit elements for each row or column have resistive values that differ from one another by powers of two.

12. The blister package of claim 11, wherein the circuit elements of one of the rows have resistive values that are identical to the resistive values of the resistive elements associated with another of the rows.

13. A package having a plurality of cavities, comprising:
   a plurality of individual package cavities arranged in rows or columns;
   wherein each individual package cavity has a unique corresponding plurality of electrical paths and at least one circuit element, the at least one circuit element being located in one of the electrical paths and having a predetermined measurable electrical characteristic that facilitates automated identification of whether the corresponding cavity has been opened;

wherein each individual package cavity has a corresponding frangible electrical circuit that is broken when the individual package cavity is opened, the broken portion eliminating one of the plurality of electrical paths associated with the individual package cavity; and further comprising one detection circuit for each row or column of individual package cavities connecting the electrical paths associated with every individual package cavity in the row or column of the package such that one or more electrical parameters corresponding to the detection circuit determines which individual package cavities of the row or column have been opened and further wherein a predetermined value for at least one electrical parameter is associated with each of every possible combination of opened cavities for each row or column.

14. The package of claim 13, further comprising a solid pharmaceutical product stored in one of the cavities.

15. The package of claim 14, further comprising a connector for connecting the package.

16. The package of claim 13, wherein each circuit element comprises a resistive element.

17. The package of claim 16, wherein the circuit elements of each row or column of the package have resistive values that differ from one another by powers of two.

* * * * *